United States Patent
Fukumoto

(10) Patent No.: US 7,362,150 B2
(45) Date of Patent: *Apr. 22, 2008

(54) METHOD AND SYSTEM FOR SYNCHRONIZING PHASE OF TRIANGULAR SIGNAL

(75) Inventor: Kenichi Fukumoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/736,503

(22) Filed: Apr. 17, 2007

(65) Prior Publication Data

US 2007/0182465 A1    Aug. 9, 2007

Related U.S. Application Data

(63) Continuation of application No. 10/543,066, filed as application No. PCT/JP2003/012240 on Sep. 25, 2003, now Pat. No. 7,224,196.

(30) Foreign Application Priority Data

Feb. 4, 2003    (JP)    ............................. 2003-027463

(51) Int. Cl.
    H03K 4/06    (2006.01)
(52) U.S. Cl. ...................... 327/131; 327/141; 327/163
(58) Field of Classification Search .................. None
    See application file for complete search history.

(56) References Cited

U.S. PATENT DOCUMENTS

| | | | |
|---|---|---|---|
| 5,459,419 A | * | 10/1995 | Hatakenaka ................. 327/141 |
| 5,917,369 A | | 6/1999 | Nguyen ........................ 330/10 |
| 6,522,209 B2 | | 2/2003 | Hughes ........................ 331/47 |
| 6,587,006 B2 | | 7/2003 | Kawajiri et al. ............. 331/45 |
| 6,859,076 B2 | | 2/2005 | Fujiwara ..................... 327/129 |
| 2003/0001683 A1 | | 1/2003 | Kawajiri et al. ............ 331/100 |
| 2004/0085102 A1 | | 5/2004 | Fujiwara ..................... 327/129 |
| 2006/0208718 A1 | | 9/2006 | Nitta et al. .................. 323/288 |

FOREIGN PATENT DOCUMENTS

| | | |
|---|---|---|
| JP | 03-155366 | 7/1991 |
| JP | 05-048406 | 2/1993 |
| JP | 08-293767 | 11/1996 |
| JP | 2000-114936 | 4/2000 |
| JP | 2002-084175 | 3/2002 |

* cited by examiner

Primary Examiner—Cassandra Cox
(74) Attorney, Agent, or Firm—Hogan & Hartson LLP

(57) ABSTRACT

A multiplicity of electronic devices is provided to generate triangular wave signals variable between an upper and lower limit voltages by charging or discharging capacitors. One of the triangular wave signals serves as a master triangular wave signal for controlling the phases of the remaining (or slave) triangular wave signals. A detection signal is generated every time the master triangular wave signal reaches predetermined threshold levels. In response to the detection signal, a capacitor associated with one slave triangular signal is promptly discharged to bring the slave triangular signal to the lower limit voltage, whereby the respective slave triangular wave signals are synchronized to be offset in phase relative to the master triangular wave signal by respective predetermined phase angles.

5 Claims, 7 Drawing Sheets

METHOD AND SYSTEM FOR SYNCHRONIZING PHASE OF TRIANGULAR SIGNAL

This is a continuation of application Ser. No. 10/543,066 filed Jul. 22, 2005 which is a 371 of international application number PCT/JP2003/012240 filed Sep. 25, 2003, the entire contents of which are incorporated by reference. This application also claims benefit of priority under 35 U.S.C. § 119 to Japanese Patent Application No. 2003-027463 filed Feb. 4, 2003 the entire contents of all of which are incorporated by reference.

TECHNICAL FIELD

The invention relates to a method and a system for generating synchronized triangular wave signals that are offset in phase for use in PWM control by a multiplicity of electronic devices.

BACKGROUND ART

There have been known a system for controlling multiple electronic devices through pulse width modulation (PWM) using multiple phase-offset triangular Wave signals, as disclosed in Japanese Patent Application Laid Open 2000-92851. This prior art system utilizes phase shifters for shifting or offsetting the phase of a given original signal to obtain the multiple phase-shifted triangular wave signals. Each of the phase shifters digitally delays the original signal by means of, for example, a register.

A conventional system that utilizing such phase shifters is complex in structure, and hence costly. Further, the prior art system is difficult to apply to a system in which the electronic devices thereof are already equipped with a triangular wave signal generator.

It is, therefore, an object of the present invention to provide a method and a system for generating a multiplicity of phase-shifted triangular wave signals by generating a multiplicity triangular wave signals by means of electronic devices and by synchronizing the triangular wave signals to be offset in phase from one another.

DISCLOSURE OF INVENTION

In accordance with one aspect of the invention, there is provided a method of generating synchronized phase-offset triangular wave signals offset-in phase, comprising steps of:

generating at least one slave triangular wave signals variable between an upper limit voltage and a lower limit voltage by charging or discharging associated capacitors;

generating a detection signal when the master triangular wave signal reaches a predetermined level; and promptly charging or discharging the associated capacitors in response to the detection signal so as to bring the slave triangular wave signal associated with the capacitor to the upper or lower limit voltage such that the at lease one slave triangular wave signal is synchronized to be offset in phase relative to the master triangular wave signal by a predetermined phase angle.

In accordance with another aspect of the invention, there is provided a method of generating synchronized triangular wave signals offset in phase, comprising steps of:

generating a first through an Nth ($N \geq 2$) triangular wave signals that are variable between an upper limit voltage and a lower limit voltage by charging or discharging associated first through Nth capacitors;

promptly charging or discharging the (J+1)st capacitor ($1 \leq J \leq N-1$) when the Jth triangular wave signal reaches a predetermined level to bring the (J+1)st triangular wave signal to the upper or lower limit voltage, whereby the first through Nth triangular wave signals are synchronized to be sequentially offset in phase by predetermined phase angles.

In accordance with still another aspect of the invention, there is provided a method of generating synchronized triangular wave signals offset in phase, comprising steps of:

generating a first through an Nth ($N \geq 2$) triangular wave signals that are variable between an upper limit voltage and a lower limit voltage by charging or discharging associated first through Nth capacitors;

promptly charging or discharging the second through Nth capacitors when the first triangular wave signal reaches the predetermined voltages respectively set for the second through Nth triangular wave signals to bring the second through Nth triangular wave signals to the upper or lower limit voltage, whereby the second through Nth triangular wave signals are synchronized to be offset in phase by predetermined phase angles relative to the first triangular wave signal.

In accordance with a further aspect of the invention, there is provided a system for generating synchronized triangular wave signals offset in phase (triangular wave signal generation-synchronization system), comprising:

a first through an Nth electronic devices ($N \geq 2$) each including a triangular wave signal generation circuit for generating a triangular wave signal that varies between an upper limit voltage and an lower limit voltage by charging or discharging an associated capacitor; and a first through an (N−1)st phase synchronization circuits each including a comparison-detection circuit receiving as a master triangular wave signal a triangular wave signal from one of said N electronic devices (said one device referred to as master electronic device) and comparing the master triangular wave signal with a predetermined. threshold voltage to generate a detection signal when the master triangular wave signal has reached the predetermined threshold voltage; and a switch for promptly charging or discharging the capacitor of one of the electronic devices, other than said master, electronic device, generating a triangular wave signal as a slave triangular wave signal in response to said comparison signal received from the comparison-detection circuit to bring the level of the slave triangular wave signal to the upper or lower limit voltage, whereby the slave triangular signal is synchronized to be offset in phase by a predetermined phase angle relative to the master triangular wave signal.

In the inventive system, the Kth triangular wave signal ($2 \leq K \leq N$) may be synchronized by the (K−1)st phase synchronization circuit to be offset in phase relative to the Kth triangular wave signal by a predetermined phase angle, thereby synchronizing the first through Nth triangular wave signals in sequence to be offset in phase. The first through (N−1)st phase synchronization circuits may be supplied with a common threshold voltage; and the first through Nth triangular wave signals may be synchronized to be offset in phase in sequence at equal intervals.

In the inventive system, the triangular wave signal generated by the Kth electronic device ($2 \leq K \leq N$) may be synchronized by the (K−1)st phase synchronization circuit to be offset in phase by a predetermined phase angle relative to the first triangular wave signal generated by the first electronic device. The first through (N−1)st phase synchronization circuits may be respectively. supplied with a threshold voltage selected from different threshold voltages, whereby the slave triangular wave signals are synchronized to be offset in phase relative to the master triangular wave signal by predetermined phase angles in accord with the respective threshold voltages.

In the inventive system, the first through Nth electronic devices may be dc-ac converters for converting dc power to ac power to supply the ac power.

In the inventive system, the comparison-detection circuit may include:

a comparator for comparing the level of the master triangular wave signal with the predetermined threshold voltage; and a change detection circuit for detecting a change in the output of the comparator to output the detection signal when detecting the change. The change detection circuit may be a differential circuit having a capacitor and a resistor.

The inventive system may comprise a reference voltage circuit for generating the upper or lower limit voltage and at least one voltage for use as the predetermined threshold voltage. The inventive system may comprise a voltage follower that is supplied with the upper or lower limit voltage and outputs the same voltage as the voltage supplied thereto.

The inventive method and system for generating phase-shifted triangular wave signals can provide a multiplicity of synchronized triangular wave signals offset in phase by predetermined phase angles without using any phase shifting means.

The invention synchronizes the triangular wave signals to have predetermined offset phases in each cycle using a master triangular wave signal, so that no frequency error will be accumulated in the synchronization if the frequencies of the triangular wave signals generated by the respective electronic devices vary slightly due to variations in characteristic of the oscillating elements of the devices.

Such synchronization of the triangular wave signals can be attained by a simply phase shifting circuit consisting of a comparator, a change detection circuit and a switch. Thus, the invention provides a simple yet cost-effective means having substantially the same phase shifting capability as a phase-shifter for a triangular wave signal.

BEST MODE FOR CARRYING OUT THE INVENTION

A method and a system for generating synchronized triangular wave signals offset in phase according to the invention will now be described in detail with reference to the accompanying drawings.

Figure 1:
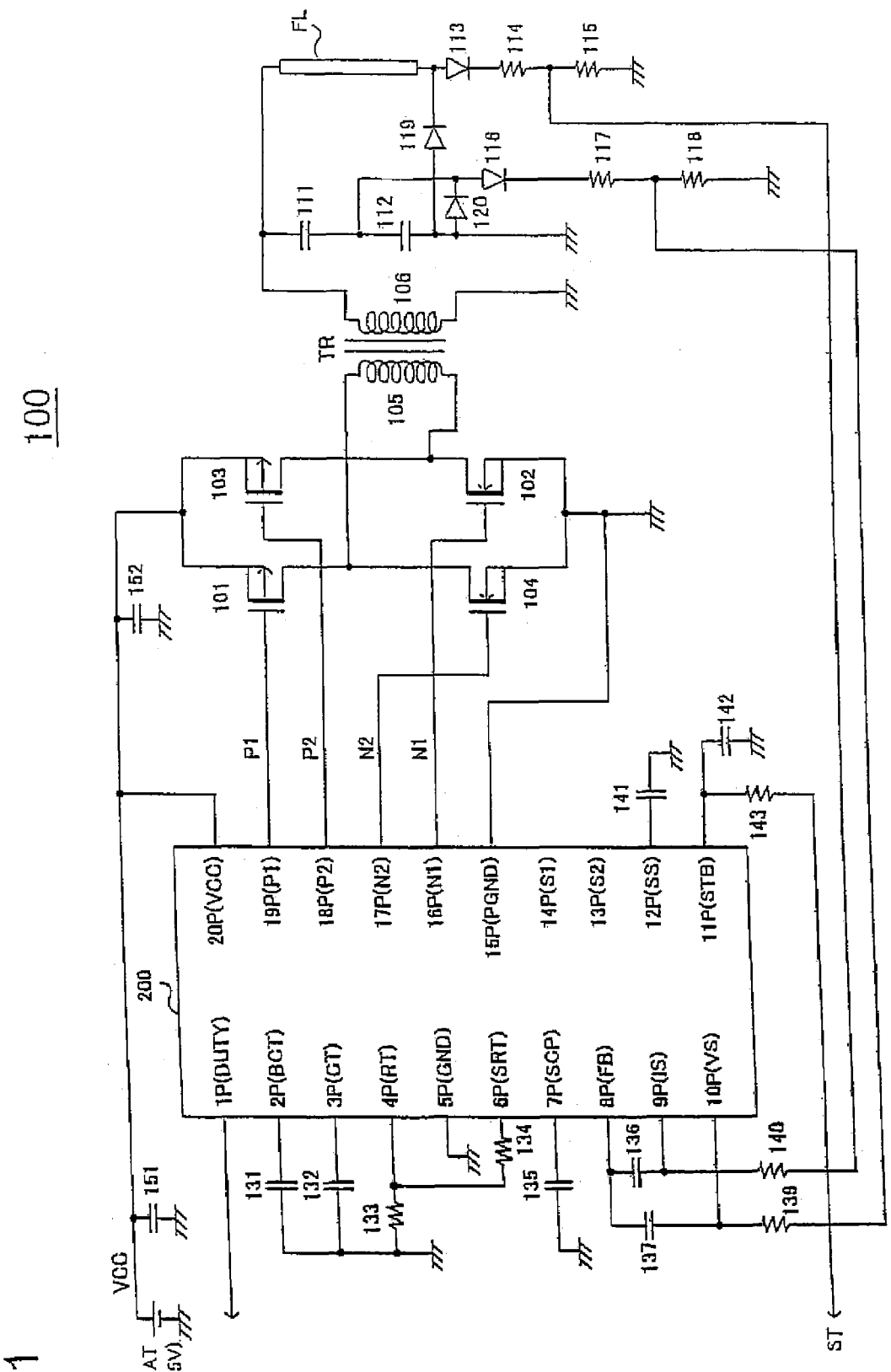
FIG. 1 is a diagram showing a general configuration of an inverter for use in the invention.
Figure 2:
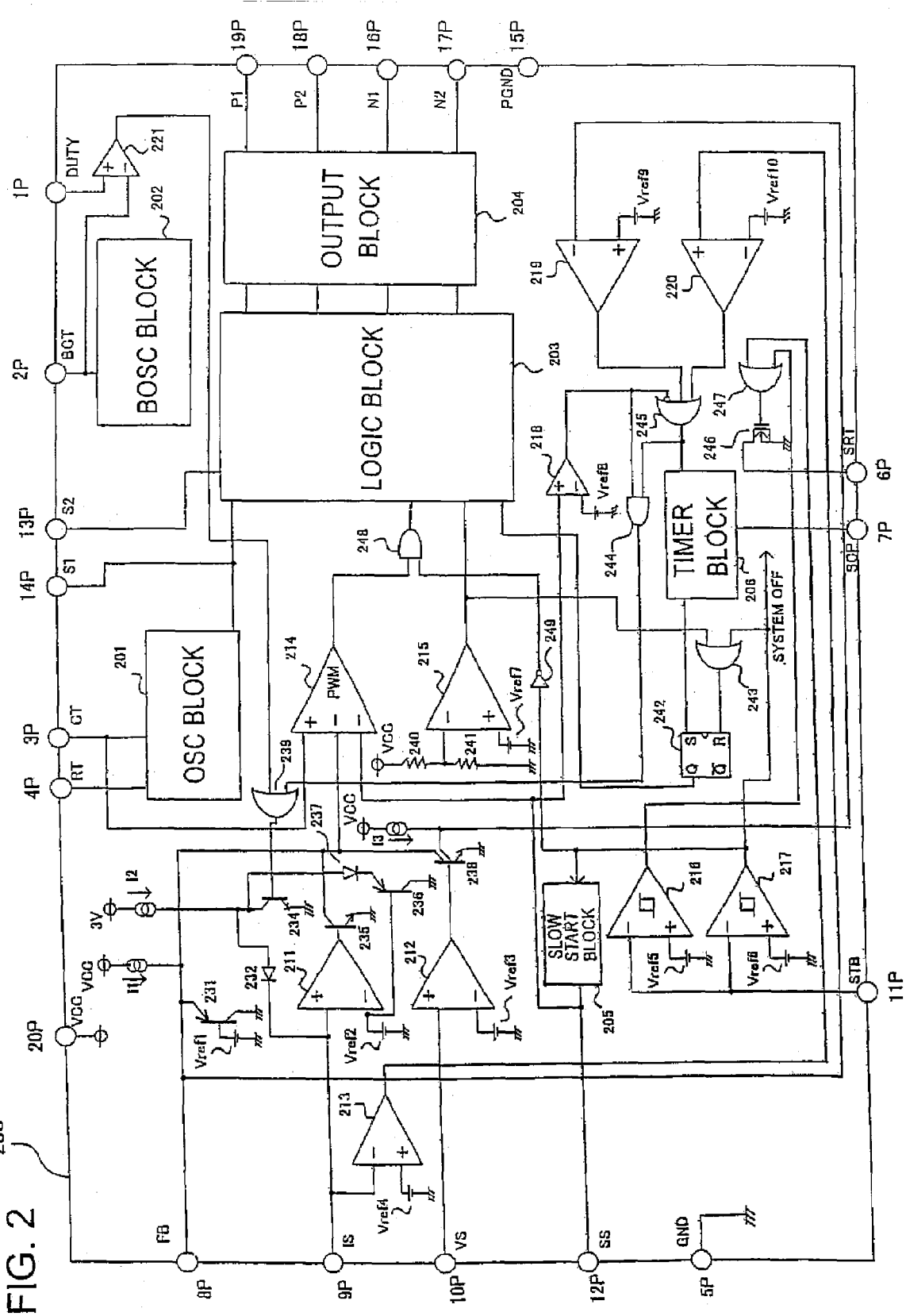
FIG. 2 is a diagram showing the internal structure of the controller IC for use with the inverter of FIG. 1.

In what follows the invention will be described with reference to parallel operating system for operating a multiplicity of cold cathode fluorescent lumps (CCFLs) using dc-ac converter (referred to as inverter). Referring first to FIGS. 1 and 2, there is shown an inverter 100 and a controller IC 200 therefor for use in the inventive parallel operating system.

As shown in FIG. 1, a first switch in the form of a P-type MOSFET (hereinafter referred to as PMOS) 101 and a second switch in the form of an N-type MOSFET (hereinafter referred to as NMOS) 102 constitute a first current path in a first direction from a dc power supply to the primary winding 105 of a transformer TR. A third switch in the form of a PMOS 103 and a fourth switch in the form of NMOS 104 constitutes a second current path in a second direction from the dc power supply to the primary winding 105 of the transformer TR. Each of the PMOSs 101 and 103 and NMOSs 102 and 104 has a body diode (that is, a back gate diode). With these body diodes, a current can be passed in the second direction opposite to the first direction. Additional diodes may be provided to provide the same function as the body diodes.

The primary winding 105 of the transformer TR is supplied with. a power supply voltage VCC from a dc power supply BAT through PMOSs 101 and 103 and NMOSs 102 and 104 to induce a high voltage across a secondary winding 106 of the transformer TR in accordance with the winding ratio of the primary to the secondary winding. The induced high voltage is supplied to the CCFL to turn it on.

Capacitors 111-112 and resistors 117-118 are provided to detect the voltage impressed on the cold cathode fluorescent light FL and feed the detected voltage back to a controller IC 200. Resistors 114 and 115 are provided to detect the current that flows through the CCFL. The detected current is fed back to the controller IC 200. The capacitor 111 is adapted to resonate with the inductance of the transformer TR. The parasitic capacitance of the CCFt also contributes to the resonance. Elements numbered 113,116,119, and 120 are diodes. Elements numbered 151 and 152 are capacitors provided to stabilize the power supply voltage.

The controller IC 200 has a multiplicity of input/output pins. The first pin 1P is a terminal for switching the mode of the controller 200 between PWM mode and intermittent operation mode (hereinafter referred to as burst mode). The first pin 1P is supplied with a duty signal DUTY for switching the operation mode and for determining the duty cycle ratio during the burst mode. The second pin 2P is a terminal for connection with a capacitor 131 for setting up an oscillation frequency of a burst mode oscillator (BOSC). The second pin 2P is coupled to the frequency setting capacitor 131 to generate across the capacitor a triangular wave signal (i.e. triangular wave signal train) BCT for initiating a burst. The triangular wave signal will hereinafter be referred to as burst triangular wave signal.

A third pin 3P is a terminal for connection with a capacitor 132 to establish an oscillation frequency of a PWM mode oscillator (OSC). A triangular wave signal CT for PWM (referred to as PWM triangular wave signal) is generated at the third pin 3P connected to the capacitor 132. A fourth pin 4P is a terminal for connection with a resistor 133 for setting up charge current to the third pin 3P. The fourth pin 4P has a potential RT, which causes a current to flow through the resistor 133 connected thereto in accord with the potential RT and the resistance of the resistor 133. A fifth pin 5P is an earth terminal having ground potential GND.

A sixth pin 6P is a terminal (referred to as charge current setting resistor terminal) for connection with a resistor for setting charge current connected to the third pin 3P. The charge current setting resistor 134 connected to the sixth pin 6P is connected in parallel with the resistor 133 or disconnected therefrom, under the control of an internal circuit of the controller IC 200. The sixth pin 6P has a potential SRT, which equals either the ground potential GND or the potential RT of the fourth pin 4P. A seventh pin 7P is a terminal for connection with a capacitor 135 for setting a timer latch. The capacitor 135 when connected to the seventh pin 7P stores a charge, developing a voltage SCP in accord with the charge. The capacitor 135 determines the time limit of protective action to protect the internal circuit of the controller IC 200.

A ninth pin 9P is an input terminal of a first error amplifier. The ninth pin 9P is fed, via a resistor 140, with a current detection signal (referred to as detection current) I in accord with the current flowing through the CCFL FL. The detection current IS is input into the first error amplifier. An eighth pin 8P is an output terminal of the first error amplifier. Connected between the eighth pin 8P and the ninth pin 9P is a capacitor 136. The potential of the eighth pin 8P serves as feedback control voltage FB for the PWM control. In what follows the ground potential is taken as the reference of voltage unless otherwise stated.

A tenth pin 10P is an input terminal of a second error amplifier. The tenth pin 10P is fed, via a resistor 139, with a voltage detection signal (hereinafter referred to as detection voltage) VS in accord with the voltage impressed on the CCFL FL. The detection voltage VS is input into the second error amplifier. Connected between the tenth pin 10P and the eighth pin 8P is a capacitor 137.

An eleventh pin 11P is a terminal for setting starting time and for starting up the inverter. A signal STB is derived from a delayed startup signal ST by removing the noise therefrom by means of a resistor 143 and a capacitor 142, and is supplied to an eleventh pin 11P. A twelfth pin 12P is a terminal for connection with a grounded capacitor 141 for setting slow-start time. A slow-start voltage SS gradually develops across the capacitor 141 during a startup.

A thirteenth pin 13P is a synchronization terminal to be connected to another controller IC when the controller 200 is to collaborate therewith. A fourteenth pin 14P is an I/O terminal of the internal clock, for connection with another controller IC when the controller 200 is to collaborate with said another controller.

A fifteenth pin. 15P is an earth terminal for an external FET drive circuit. A sixteenth pin 16P is a terminal for outputting a gate drive signal N1 of the NMOS 102. A seventeenth pin 17P is a terminal for outputting a gate drive signal N2 of the NMOS 104. An eighteenth pin 18P is a terminal for outputting a gate drive signal P2 of the PMOS 103. A nineteenth pin 19P is a terminal for outputting a gate drive signal P1 of the PMOS 101. A twentieth pin 20P is a power supply terminal for receiving the power supply voltage VCC.

As shown in FIG. 2 illustrating the internal structure of the controller IC 200, an oscillation (OSC) block 201 generates a PWM triangular wave signal CT having a period of cycle determined by the capacitor 132 connected to the third pin 3P and the resistors 133-134 connected to the fourth pin 4P, and supplies the signal CT to a PWM comparator 214, The OSC block 201 also generates an internal clock and supplies it to a logic block 203.

A BOSC block 202 is an oscillation circuit (hereinafter referred to as burst triangular wave signal generation circuit) for generating a burst triangular wave signal B CT having a frequency determined by the capacitor 131 connected to the second pin 2P. The frequency of the burst triangular wave signal B CT is set much lower than the frequency of the PWM triangular wave signal CT. (That is, BCT frequency<CT frequency.) The dc voltage supplied to the first pin 1P (that is, analog duty signal DUTY) is compared with the burst triangular wave signal BCT in a comparator 221. The output of the comparator 221 is used to drive an NPN transistor (hereinafter referred to as NPN) 234 via an OR circuit 239. In a case where a digital (PWM) duty signal is supplied to the first pin 1P, a resistor is connected to the second pin 2P to output a predetermined burst voltage from the BOSC block 202.

The logic block 203 is supplied with a PWM control signal, for example, to generate a switch drive signal in accord with a predetermined logic. An output block 204 generates gate drive signals P1, P2, N1, and N2, in accord with the switch drive signal received from the logic block 203, and supplies them to the respective gates of the PMOSs 101 and 103 and NM OSs 102 and 104.

A slow-start block 205 is started up by the output of a comparator 217 when the startup signal ST is supplied and the signal STB input to the comparator 217 is raised slowly by the capacitor 142 and resistor 143 above a reference voltage Vref6. The output of the comparator 217 enables the logic block 203. A circuit 249 is an inversion circuit. The output of the comparator 217 resets a flip-flop (FF) circuit 242 via an OR circuit 243. As the start block 205 is started up, the slow-start voltage SS gradually rises, which is input to the PWM comparator 214 as a comparison input. Thus, during a startup, PWM controlled by the slow-start voltage SS.

It is noted that during a startup, the comparator 216 turns off an NMOS 246 via an OR circuit 247 when the input to the comparator 216 exceeds a reference voltage Vref5. This causes the resistor 134 to be separated from the controller IC 200 and the frequency of the PWM triangular wave signal CT to be changed. The OR circuit 247 is also fed the output of a comparator 213.

A first error amplifier 211 compares the detection current IS that is proportional to the current flowing through the CCFL FL with a reference voltage Vref2 (which is, for example, 1.25 V), and generates an output in accord with the error between them to control an NPN 235 connected to a constant-current source I1. The collector of the NPN 235 is connected to the eighth pin 8P. Thus, the potential of the node (i.e. the eighth pin 8P) serves as the feedback voltage FB to be input to the PWM comparator 214 as a comparison input.

The PWM comparator 214 compares the triangular wave signal CT with the lower one of the feedback voltage FB and the slow-start voltage SS to generate and provide PWM control signals to the logic block 203 via an AND circuit 248. Under a steady state condition reached subsequent to a startup, the triangular wave signal CT is compared with the feedback voltage FB for automated control of the current flowing through the CCFL FL at a preset level.

Because the capacitor 136 is connected between the eighth pin 8P and the ninth pin 9P, the feedback voltage FB increases and decreases smoothly. As a consequence, the PWM control is carried out smoothly, without an abrupt change.

A second error amplifier 212 compares the detection voltage VS that is proportional to the voltage across the CCFL FL with a reference voltage Vref3 (which is 1.25 V, for example) to generate an output voltage indicative of the difference between them. This output is used to control a double-collector type NPN 238 having one collector connected to the constant-current source I1 and the other collector connected to a constant-current source I3. Since the collector of the NPN 238 is also connected to the pin 8P, the feedback voltage FB is also controlled by the detection voltage VS. That is, the comparator 212 and the NPN 238 together constitute a feedback signal control circuit for controlling the feedback signal FB.

Incidentally, if the feedback voltage FB exceeds a reference voltage Vref1 (e.g. 3 V), a PNP transistor (hereinafter referred to as PNP) 231 will be turned on to limit excessive rise of the feedback voltage FB.

A comparator 215 compares the power supply voltage VCC with the voltage generated by dividing the power supply voltage VCC by resistors 240 and 241 and with a reference voltage Vref7 (e.g. 2.2 V), and, when the power supply voltage VCC reaches a predetermined level, inverts its output to reset the FF circuit 242 via the OR circuit 243.

A comparator 218 compares the slow-start voltage SS with a reference voltage Vref8 (e.g. 2.2 V) to turn on the NPN 234 via an AND circuit 244 and an OR circuit 239 when the voltage SS exceeds the reference voltage Vref8. The NPN 234, when turned on, causes a diode 232 to be reversely biased by a current source I2 and hence enables the first error amplifier 211 to perform its normal operation. Thus, the NPN 234, diode 232, and the current source I2 constitute a switching circuit for switching the control mode between burst control mode and pulse width control mode. A diode 237 and a PNP 236 are provided to sup press an over-voltage.

When the NPN 238 is turned ON by the second error amplifier 212, its collector voltage lowers below a reference voltage Vref9 (e.g. 3 V). This causes the output voltage of a comparator 219 to be reversed. A comparator 220 compares the feedback voltage FB with a reference voltage Vref10 (e.g. 3 V), and inverts its output voltage when the feedback voltage FB exceeds the reference voltage Vref10. The outputs of the comparators 219 and 220 are input, along with the inverted output of the comparator 218, to a timer block 206 via an OR circuit 245. The timer allows the inverted signal to be output a predetermined time later. The output of this timer block 206 is supplied to the FF 242 to reset it, the Q output of which in turn disables the logic block 203.

The CCFL controlled by the inverter in the manner as described above is used as a backlight source of, for example, an LCD display of a notebook PC and of a TV set. In a recent large sized LCD display, a multiplicity of distributed CCFLs is often collectively used as backlight sources.

In such cases, in order to supply the output of a single inverter to the CCFLs, it is necessary to implement a multiplicity of high-voltage power lines. The lengths of these power lines are preferably as short as possible, since the high-voltage power lines have electromagnetic influence on the surrounding components. Short power lines are also advantageous from the point of establishing effective resonance between the parasitic capacitances of the CCFLs and the inductance of the transformer. For these reasons, the inverter for controlling the respective CCFLs is preferably provided in proximity to the respective CCFLs.

Figure 3:
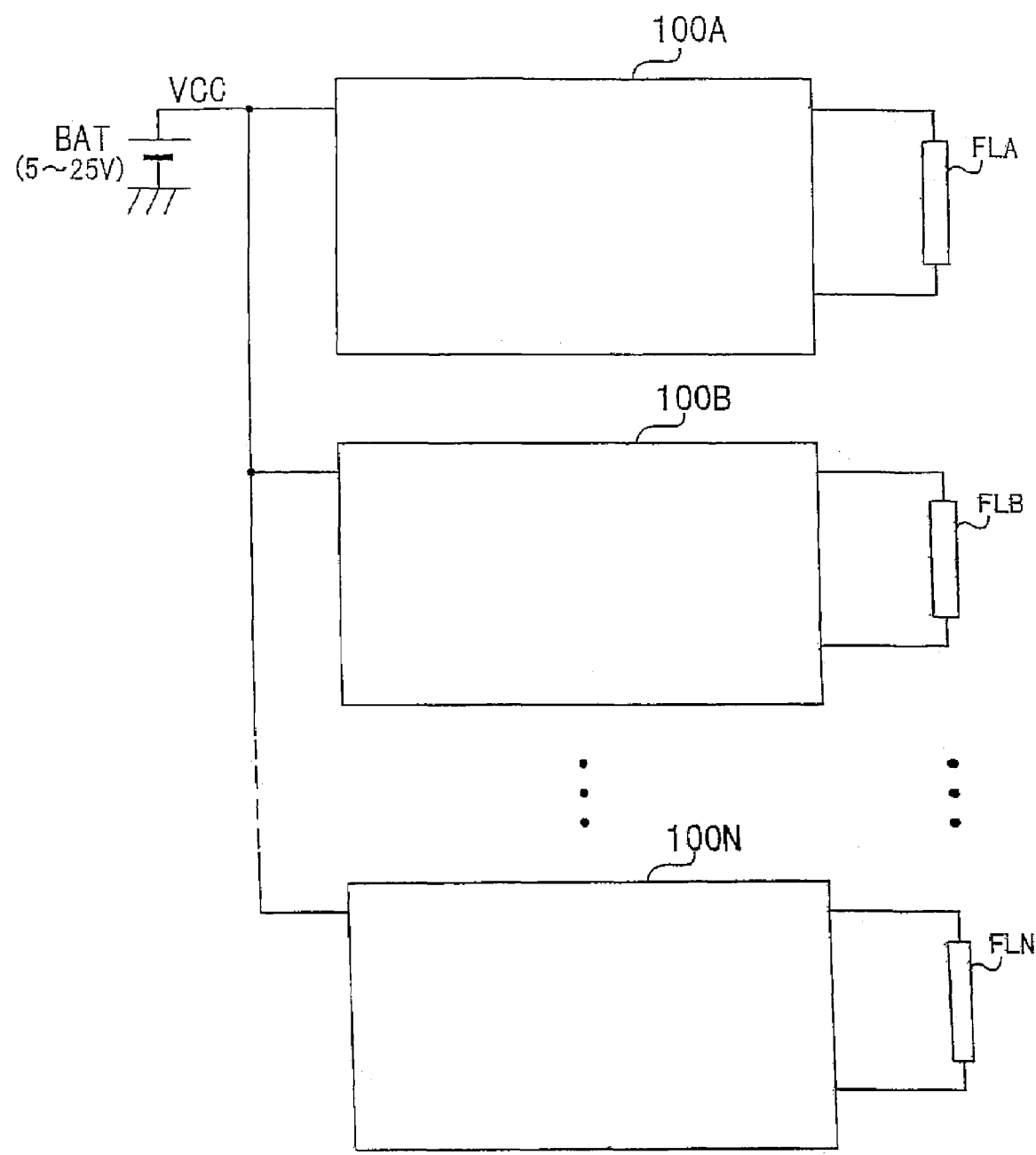
FIG. 3 is a block diagram showing a system of inverters connected for parallel operation in accordance with one embodiment of the invention.

FIG. 3 shows an arrangement of a system for operating a multiplicity of inverters 100A-100C in parallel. The inverters 100A-100C are provided in close proximity to the corresponding C C F L s F L A-F L C distributed at different positions of an LCD display.

Although three CCFLs are shown in FIG. 3, an arbitrary number of CCFLs can be provided. Each of the inverters may be connected two or more than two CCFLs. In this case, the transformer TR of FIG. 1 is configured to have two or more than two secondary windings for supplying power to the respective CCFLs. Alternatively, the controller IC 200 may be provided with a multiplicity of PWM control circuits for outputting said multiplicity of PWM control signals.

The output power of the backlight sources may be regulated to regulate the brightness of the CCFLs by controlling the bursts of the inverters. In the burst control, it is desirable to evenly utilize the multiple inverters to minimize the load on the power supply circuit used. To do this, it is necessary to offset the phases of the burst triangular wave signals BCTs in the respective inverters.

Figure 4:
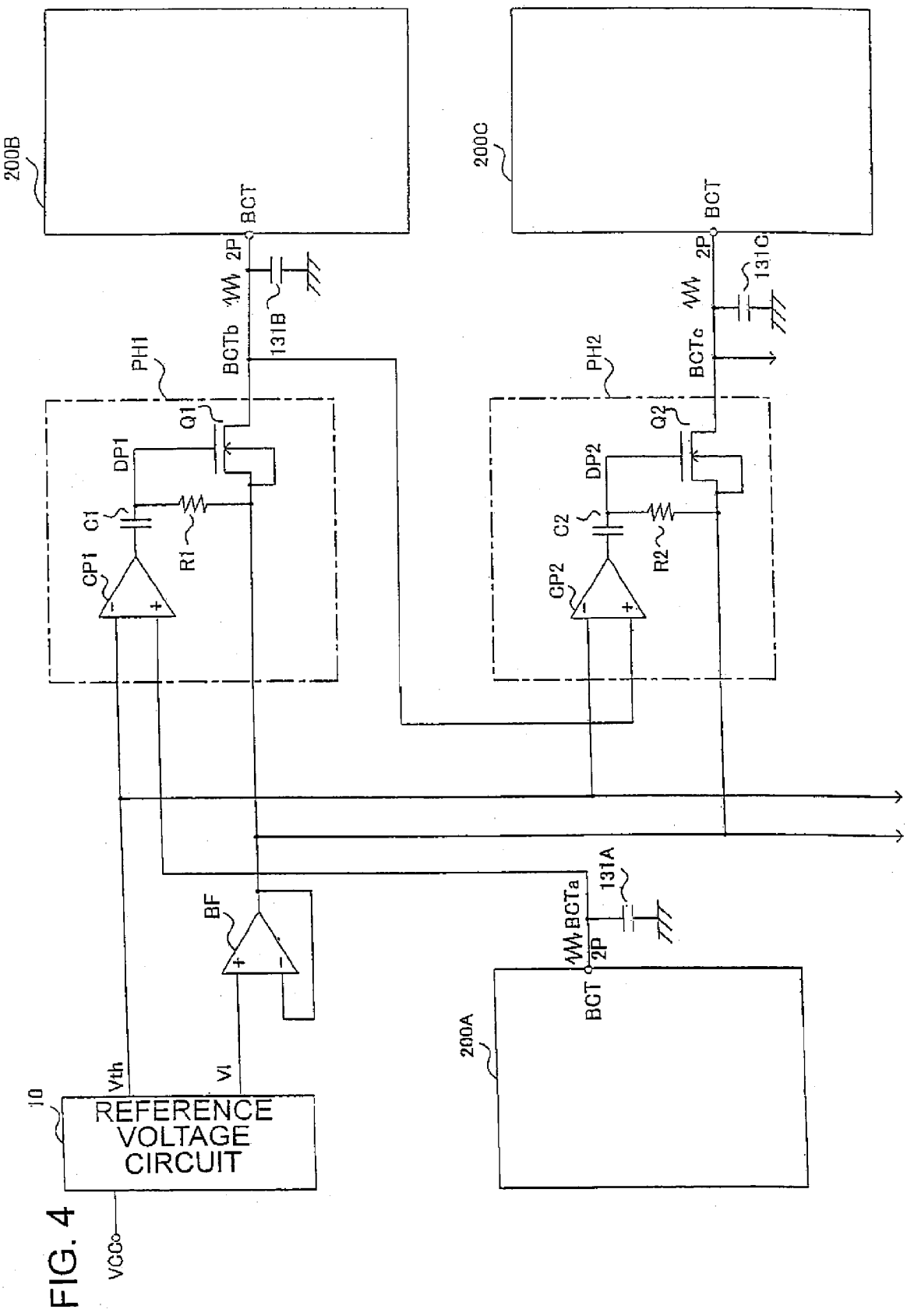
FIG. 4 is a diagram showing a first phase synchronization system for use in the parallel operation of the inverters shown in FIG. 3.
Figure 5:
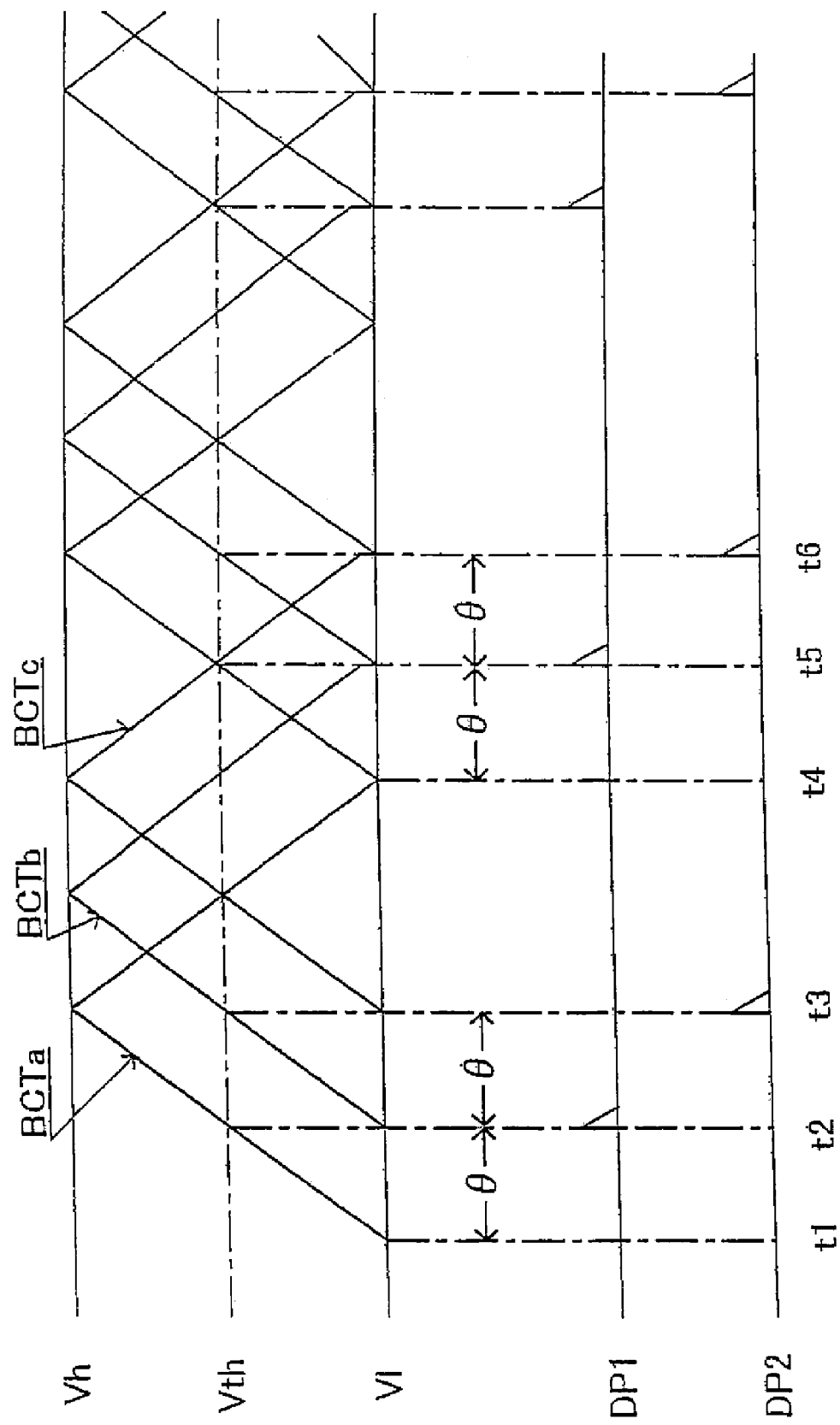
FIG. 5 is a timing diagram illustrating the operation of the phase synchronization system of FIG. 4.

Referring to FIGS. 4-7, there is shown a method and a system for synchronizing the triangular wave signals BCTs to be offset in phase. Particularly, FIG. 4 shows a first embodiment of the invention for synchronizing the triangular wave signals BCTs of the inverters to be offset in phase by predetermined phase angles. FIG. 5 shows a timing diagram useful in understanding the operation of the embodiment of FIG. 4.

Each of the controller ICs 200A-200C has the same structure as the one described in connection with FIG. 2. The controller ICs 200A-200C are configured to generate burst triangular wave signals BCTa-BCTc, respectively, having the identical frequency. Each of the burst triangular wave signals BCTa-BCTc is utilized by internal circuitries of the respective controller IC and output from the external terminal 2P thereof. The capacitors. 131A-131C externally connected to the respective external terminals 2P are provided to generate triangular wave signals through charging or discharging thereof. The capacitors may be provided within the respective controller ICs 200A-200C.

Although the burst triangular wave signals BCTa-BCTc are intended to have the same frequency, their frequencies are likely to be slightly different from one another due to variations in characteristics of the elements used in the controller ICs. The triangular wave signals BCTa-BCTc, therefore, cannot sustain their initially given phase differences.

A reference voltage circuit 10 generates from the power supply voltage VCC a threshold voltage Vth and a lower limit voltage Vl defining the lower limit of the triangular wave signal BCT. The threshold voltage Vth is directly supplied to the phase synchronization circuits PH1 and PH2, but the lower limit voltage Vl is supplied to the phase synchronization circuits PH1 and PH2 via a buffer circuit BF. The reference voltage circuit 10 can be, in the simplest form, a resistive voltage division circuit. The reference voltage circuit 10 can be a constant voltage circuit when it is required to have high output precision.

The buffer circuit BF has extremely small output impedance so that it outputs virtually the same voltage as the voltage supplied thereto. It can be a voltage follower. To implement this function, the buffer circuit BF can be replaced by a capacitor having a fairly large capacitance.

The reference voltage circuit 10 and the buffer circuit BF can be formed integral with one of the phase synchronization circuits PH1 and PH2.

The phase synchronization circuit PH1 includes: a comparator CP1 having a non-inverting input terminal (+) receiving the triangular wave signal BCTa of the master controller IC 200A and an inverting input terminal (−) receiving the threshold voltage Vth; a differential circuit formed of a capacitor C1 and a resistor R1 for differentiating the output of the comparator CP1 to provide a differential output DP1 (referred to as detection signal); and a switch Q1 that is switched on by the detection signal DP1. The switch Q1 suffices to be switched on while the detection signal DP1 is output from the differential circuit, so that it can be implemented by an N-type MOS transistor as shown or an NPN transistor.

The switch Q1 is connected between the output terminal of the buffer circuit BF and the external terminal 2P of the first slave controller IC 200B. When the switch Q1 is turned on, the capacitor 131B is discharged until its voltage reduces to the lower limit voltage Vl.

Alternatively, the capacitor 131B may be adapted to be quickly charged up to an upper limit voltage Vh of the triangular wave signal BCT by a power source providing the upper limit voltage Vh when the switch Q1 is turned on. In this case, the phase synchronization is executed based on the upper limit voltage Vh.

The phase synchronization circuit PH2 has the same structure as the phase synchronization circuit PH1. However, the non-inverting input terminal (+) of the comparator CP2 is fed the triangular wave signal BCTb of the first slave controller IC 200B, and the switch Q2 is connected between the output terminal of the buffer circuit BF and the external terminal 2P of the second slave controller 200C, so that the capacitor 131C is quickly discharged until its voltage falls to the lower limit voltage Vl when the switch Q2 is turned on.

In the same manner, when a third slave controller IC 200D (not shown.) is provided, the triangular wave signal BCTc of the second slave controller IC 200C is supplied to the third phase synchronization circuit PH3 (not shown) associated with the third slave controller IC 200D. In this way, an arbitrary number of controller ICs can be provided as needed.

The reference voltage circuit 10, buffer circuit B F, and phase synchronization circuits PH1 and PH2 can be formed within any one of the inverters, for example within the inverter 100A having the master controller IC 200A.

Referring to the timing diagram shown in FIG. 5, operation of a first inventive system of FIG. 4 will now be described.

When impressed with the power source voltage VCC, controller ICs 200A-200C start generating triangular wave signal BCTa-BCTc, respectively. The triangular wave signal BCTa of the master controller IC 200A begins to rise from the lower limit voltage Vl at time t1 and oscillates with a predetermined frequency, as shown in FIG. 5. Since the triangular wave signal BCTa is a mater signal, it can oscillate independently of the rest of the triangular wave signals BCTb and BCTc.

When the triangular wave signal BCTa reaches the threshold voltage Vth at time t2, the output of the comparator CP1 is pulled up from a low (L) level to a high (H) level. A detection signal DP1, obtained by differentiating this output going from L to H level, is supplied to the switch Q1, turning on the switch Q1. As the switch Q1 is turned on at time t2, the charge stored in the capacitor 131B is promptly discharged, causing the voltage of the capacitor 131B to lower to the lower limit voltage Vl. As a consequence, the triangular wave signal BCTb of the first slave controller IC 200B is forced to rise at time t2, irrespective of its phase at that time. The triangular wave signal BCTb lags in phase behind the triangular wave signal BCTa by a predetermined phase angle θ.

When the triangular wave signal BCTb reaches the threshold voltage Vth at time t3, the output of the comparator CP2 goes up from L level to H level. Then a detection signal DP2 obtained by differentiating this output going high is supplied to the switch Q2, thereby turning on the switch Q2. As the switch Q2 is turned on, the charge stored in the capacitor 131C is discharged, causing the voltage of the capacitor 131C to promptly drop to the lower limit voltage Vl. As a consequence, the triangular wave signal BCTc of the second slave controller IC 200C is forced to rise at time t3, irrespective of its phase at that time. Accordingly, the triangular wave signal BCTc lags behind the triangular wave signal BCTb by a further predetermined phase angle θ.

The sequence of such transitions in phase of the triangular wave signals will be repeated at times t4, t5, and t6. Thus, each of the triangular wave signals BCTa-BCTc is synchronized to have a predetermined phase difference of θ relative to the master triangular wave signal BCTa. In this way, if the elements of the oscillation circuits have slight variances in characteristics, the triangular wave signals BCTa-BCTc will not have accumulated frequency errors caused by the variances.

Thus, all of the controller ICs 200A-200C, and hence all of the inverters, can sustain predetermined phase differences adequate for burst control in brightness regulation.

It should be appreciated that such burst control can be attained by a simple phase synchronization circuits PH1 and PH2 each consisting of a switch and a comparator equipped with a differential circuit. Thus, the invention provides simple, practical, and cost-effective means for providing phase-offset triangular wave signals.

It should be further appreciated that the invention enables shifting or offsetting phases of an arbitrary number of triangular wave signals by sequentially offsetting the phase of the second one by a first controller IC 200A (serving as a master controller), offsetting the phase of the third one by the second controller IC 200B (serving as a first slave controller), etc.

Figure 6:
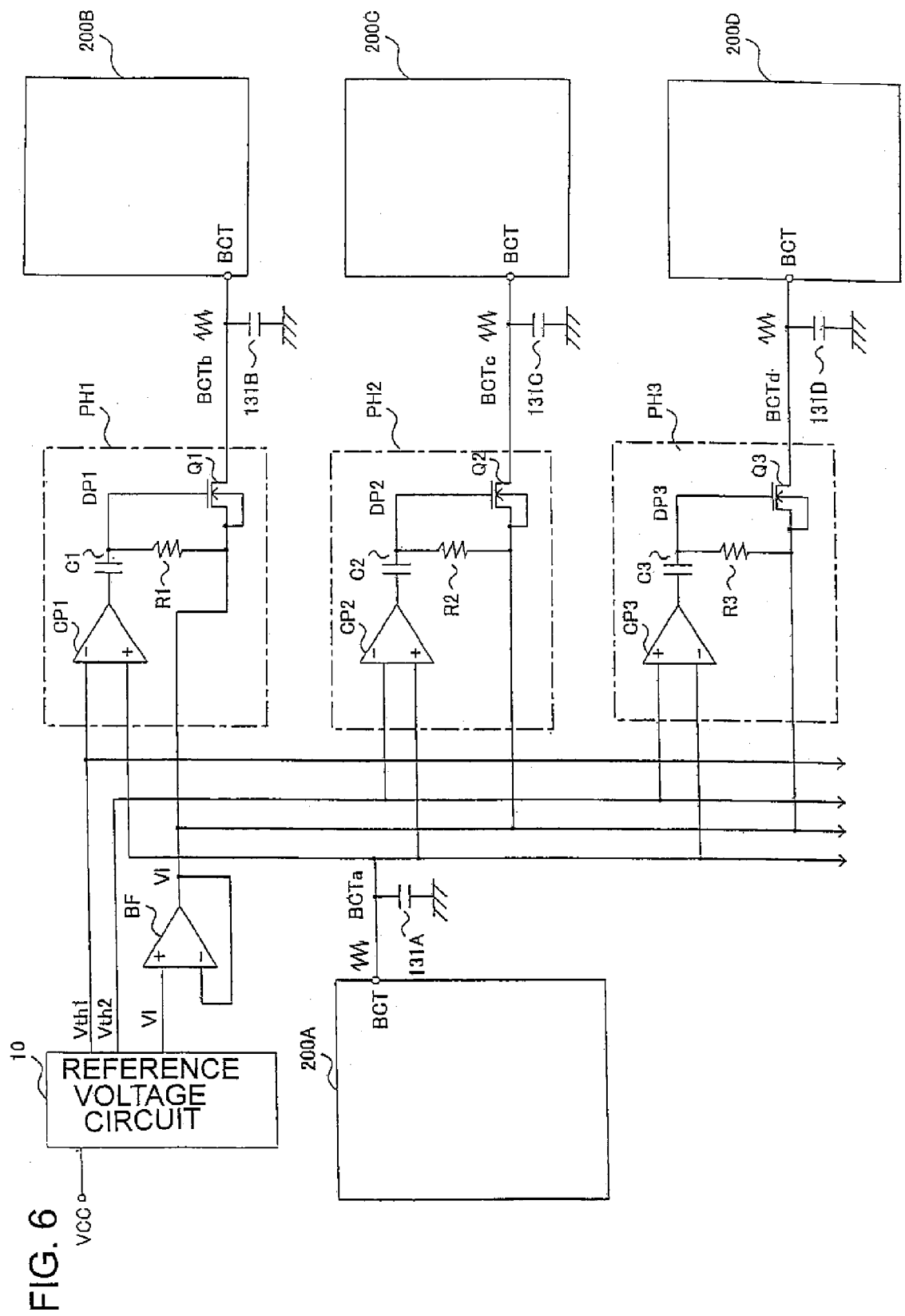
FIG. 6 is a diagram showing a second phase synchronization system for use in the parallel operation of the inverters shown in FIG. 3.
Figure 7:
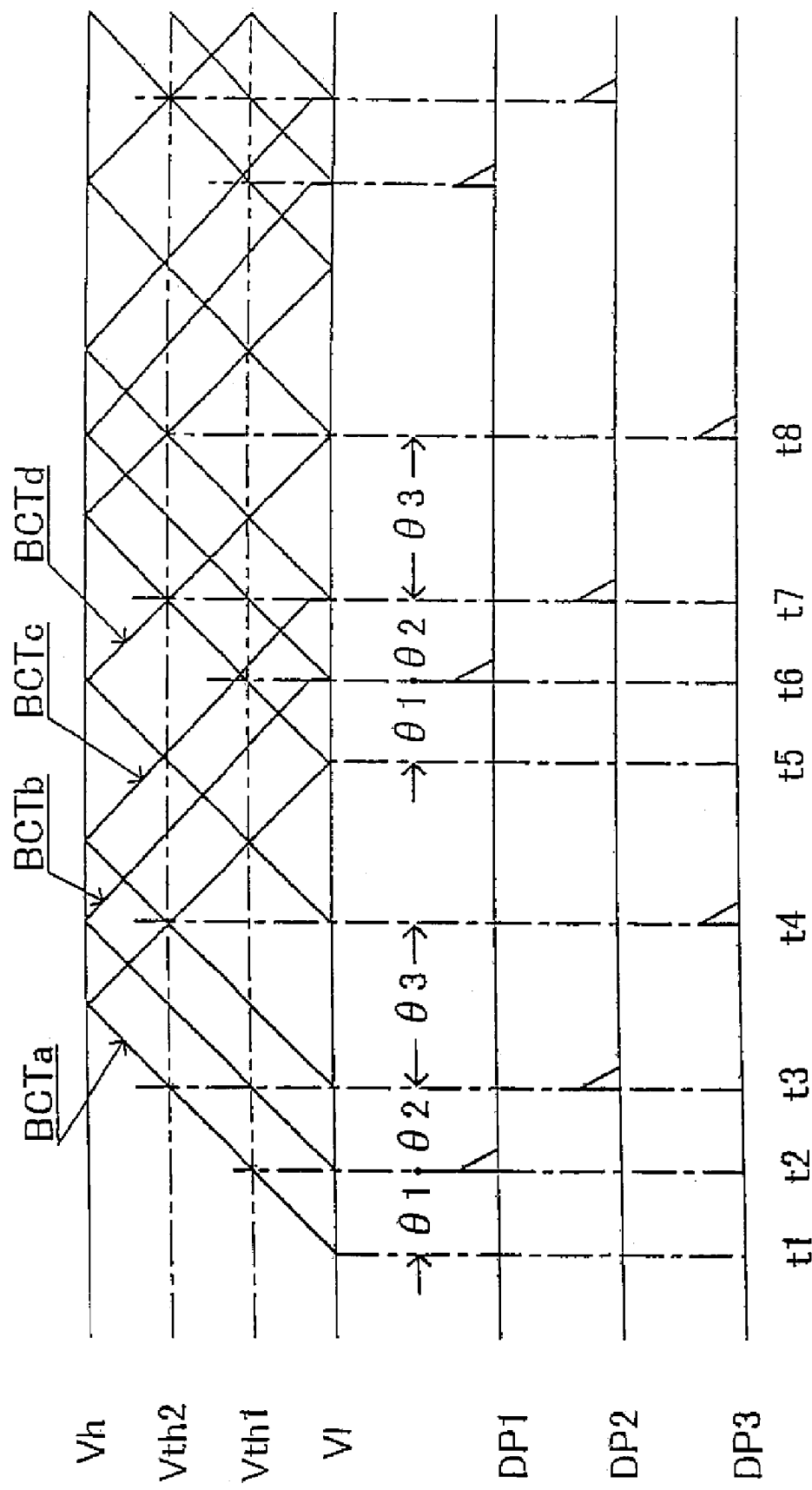
FIG. 7 is a timing diagram illustrating the operation of the phase synchronization system of FIG. 6.

Referring to FIG. 6, there is shown a second inventive system for generating phase-offset burst triangular wave signals BCTs by inverters. FIG. 7 shows a timing diagram illustrating the operation of the system. shown in FIG. 6.

As seen in FIG. 6, the second system differs from the first system shown in FIG. 4 in that: the reference voltage circuit 10 is adapted to provide a multiplicity of threshold voltages Vh1 and Vth2; the multiplicity of threshold voltages Vh1 and Vh2 are selectively supplied as reference voltages to the respective phase synchronization circuits PH1-PH3 as shown; and the triangular wave signal BCTa of a master controller IC is supplied as a reference voltage to all of the phase synchronization circuits PH1-PH3.

Furthermore, the phase synchronization circuit PH3 is fed at the non-inverting input terminal (+) thereof the threshold voltage Vth2 and at the inverting input terminal (−) thereof the triangular wave signal BCTa. As a consequence, the switch Q3 of the phase synchronization circuit PH3 is turned on when the triangular wave signal BCTa is lowered from H level to the threshold voltage Vth2.

The operation of the second system of FIG. 6 will now be described with reference to FIG. 7.

When impressed with the power source voltage, the controller ICs 200A-200C starts generating triangular wave signals BCTa-BCTc, respectively. The triangular wave signal BCTa of the master controller IC 200A begins to rise from the lower limit voltage Vl at time t1 and oscillates with a predetermined frequency, as shown in FIG. 7. Since the triangular wave signal BCTa is a master signal, it can oscillate freely independently of other triangular wave signals BCTb-BCTd.

When the triangular wave signal BCTa reaches the threshold voltage Vth1 at time t2, the output of the comparator CP1 is pulled up from L level to H level. A detection signal DP1 obtained by differentiating the output of the comparator CP1 going from L to H is supplied to the switch Q1, turning on the switch, which in turn causes the charge stored in the capacitor 131B to be promptly discharged to lower the voltage of the capacitor 131B to lower to the lower limit voltage Vl. As a result, the triangular wave signal BCTb generated by the first slave controller IC 200B rises at time t2 irrespective of its phase at that time. The triangular wave signal BCTb lags in phase behind the triangular wave signal BCTa by a predetermined angle of θ1.

When the triangular wave signal BCTa reaches the threshold voltage Vth2 at time t3, the output of the comparator CP2 is pulled up from L level to H level. This causes a similar rise of the triangular wave signal BCTC generated by the second slave controller IC 200C at time t3, irrespective of its phase at that time. As a consequence, the triangular wave signal BCTc lags in phase behind the triangular wave signal BCTb by a predetermined angle of θ2.

As the triangular wave signal BCTa reaches the second threshold voltage Vth2 at time t4 in the course of falling from H level, the output of the comparator CP3 is pulled up from L level to H level at that time. The detection signal DP3 obtained by differentiating this output going high is supplied to the switch Q3, thereby turning on the switch Q3. As a consequence, the triangular wave signal BCTd issued from the third slave controller IC 200D is forced to rise at time t4, irrespective of its phase at that time. The triangular wave signal BCTcd lags in phase behind the triangular wave signal BCTc by a predetermined phase angle of θ3.

Similar transitions of the triangular wave signals will be repeated at times t5, t6, t7, and t8. Accordingly, the triangular wave signals BCTb-BCTd will lag in phase by θ1, θ1+θ2, and θ1+θ2+θ3, respectively, relative to the master triangular wave signal BCTa in each cycle. Thus, the triangular wave signals BCTa-BCTd are successfully synchronized to maintain said phase differences without being affected by the possible variations in characteristics of the elements in the oscillation circuits.

Thus, in the second embodiment also, frequency. errors will not accumulate in the sequential synchronization of the triangular wave signals, thereby maintaining intended phase shifting (θ1, θ1+θ2, θ1+θ2 +θ3) of the burst signals.

It should be noted that the invention enables generation of three triangular wave signals having three arbitrary phase angles in each period of cycle by: generating a multiplicity of threshold voltages Vth1 and Vth2 serving as reference voltages; providing the triangular wave signal BCTa of the master controller IC 200A to the slave controller ICs 200B-200D as a comparison voltage; and reversing the connection of the input terminals for the reference voltage Vth and the comparison voltage BCTa of one or more of the phase synchronization circuits (PH3 in the example shown in FIG. 6) as compared with other phase synchronization circuits.

INDUSTRIAL APPLICABILITY

As will be understood from the detailed description above, the inventive method and system for generating synchronized triangular wave signals offset in phase are suited for a system running a multiplicity of inverters in parallel. Particularly, the invention is suitable for use with a backlight source of an LCD display utilizing a multiplicity of fluorescent lamps.

The invention claimed is:

1. A system for synchronizing triangular wave signals in phase (triangular wave signal phase synchronization system), said system comprising:
   a reference voltage circuit for generating a first and a second reference voltage from the voltage of a power supply;
   a first electronic device having a terminal for outputting a triangular wave signal
   a second electronic device having a capacitor connection terminal for connecting thereto a capacitor;
   a comparison detection circuit receiving said triangular wave signal and first reference voltage;
   a change detection circuit for outputting a detection signal indicative of a change in the output of said comparison detection circuit; and
   a switch adapted to provide said second reference voltage to said capacitor connection terminal of said second electronic device in response to said detection signal.

2. The triangular wave signal phase synchronization system according to claim 1, wherein said change detection circuit is a differential circuit having a capacitor and a resistor.

3. The triangular wave signal phase synchronization system according to claim 1, wherein each of said first and second electronic devices is a DC-AC converter that is connected to a load, converts the dc power of said power supply to ac power, and supplies said ac power to the respective load.

4. The triangular wave signal phase synchronization system according to claim 1, wherein said terminal of said first electronic device for outputting a triangular wave signal is connected to a capacitor, whereby the frequency of said triangular wave signal is determinable based on the capacitance of said capacitor.

5. The triangular wave signal phase synchronization system according to claim 1, wherein said second reference voltage is provided to said capacitor connection terminal to charge the capacitor connected to said capacitor connection terminal, whereby the triangular wave signal generated by said first electronic device and the triangular wave signal generated by said second electronic device has a prescribed phase difference.

* * * * *